(12) United States Patent
Tsai et al.

(10) Patent No.: US 8,288,181 B2
(45) Date of Patent: Oct. 16, 2012

(54) LIGHT EMITTING DIODE AND FABRICATING METHOD THEREOF

(75) Inventors: Tzong-Liang Tsai, Hsinchu (TW);
Way-Jze Wen, Hsinchu (TW);
Chang-Han Chiang, Hsinchu (TW);
Chih-Sung Chang, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 12/833,648

(22) Filed: Jul. 9, 2010

(65) Prior Publication Data

US 2010/0279443 A1 Nov. 4, 2010

Related U.S. Application Data

(62) Division of application No. 11/109,345, filed on Apr. 19, 2005, now Pat. No. 7,768,022.

(30) Foreign Application Priority Data

Jan. 21, 2005 (TW) ................ 94101801 A

(51) Int. Cl.
*H01L 21/00* (2006.01)

(52) U.S. Cl. ............... 438/22; 438/25; 438/26; 438/27; 438/29

(58) Field of Classification Search .............. 438/22, 438/25, 26, 27, 29
See application file for complete search history.

(56) References Cited

U.S. PATENT DOCUMENTS

| | | | |
|---|---|---|---|
| 6,818,531 B1 | 11/2004 | Yoo et al. | |
| 6,878,563 B2 | 4/2005 | Bader et al. | |
| 7,459,373 B2 | 12/2008 | Yoo | |
| 2004/0115849 A1* | 6/2004 | Iwafuchi et al. | 438/25 |
| 2004/0248377 A1* | 12/2004 | Yoo et al. | 438/458 |
| 2005/0151136 A1 | 7/2005 | Liu | |
| 2006/0099730 A1 | 5/2006 | Lee et al. | |
| 2006/0154390 A1 | 7/2006 | Tran et al. | |

* cited by examiner

*Primary Examiner* — Samuel Gebremariam
(74) *Attorney, Agent, or Firm* — Ding Yu Tan

(57) ABSTRACT

A light emitting diode and its fabricating method are disclosed. A light emitting diode epitaxy structure is formed on a substrate, and then the light emitting diode epitaxy structure is etched to form a recess. The recess is then filled with a transparent dielectric material. An adhesive layer is utilized to adhere a conductive substrate and the light emitting diode epitaxy structure. Next, the substrate is removed.

19 Claims, 3 Drawing Sheets

LIGHT EMITTING DIODE AND FABRICATING METHOD THEREOF

CLAIM PRIORITY

This application is a divisional of U.S. application Ser. No. 11/109,345, filed Apr. 19, 2005, which claims the right of priority based on Taiwan Patent Application No. 094101801 filed on Jan. 21, 2005.

FIELD OF THE INVENTION

The present invention relates to a light emitting diode and its fabricating method, especially to an AlGaInN light emitting diode and its fabricating method.

BACKGROUND OF THE INVENTION

Since Light emitting diodes (LEDs) have the advantage of low production cost, simple structure, less consuming power, small size and easy installation, they are widely applied in light sources and display devices. In the market of blue-light light emitting diode, AlGaIhnN light emitting diodes gain more attentions then others.

Traditionally, an AlGaInN LED epitaxy structure is first formed on a substrate, and then a conductive substrate is bonded to the AlGaInN LED epitaxy structure by an adhesive layer. The substrate is removed subsequently. To obtain the AlGaInN LED epitaxy structure of high quality, the preferred material of the substrate is sapphire. Traditionally, the sapphire substrate may be removed from the AlGaInN LED structure by using a laser beam. The laser beam passes through the sapphire substrate, and decomposes the n-type semiconductor layer of the AlGaInN LED epitaxy structure, contacting the substrate, into Ga and $N_2$. Then, Ga is melted by heat of a designated temperature, making the sapphire substrate easily removed from the AlGaInN LED epitaxy structure. During the removing step, the adhesive layer might be decomposed, if the laser beam ever illuminates the adhesive layer, making the conductive substrate separating from the AlGaInN LED epitaxy structure. This is a possible drawback.

Yoo et al. of U.S. Pat. No. 6,818,531, which disclosed a method for manufacturing vertical GaN LED, has overcome the drawback mentioned above. Referring to FIG. 1, an AlGaInN LED epitaxy structure 125 has a residue 125a of an n-type semiconductor layer. A conductive substrate 131 is bonded to the AlGaInN LED epitaxy structure 125 by an adhesive layer 124. As a laser beam is employed on lower surface of the substrate 121 to remove the substrate 121 from the AlGaInN LED epitaxy structure 125, the residue 125a of the n-type semiconductor layer prevents melting of the adhesive layer 124, and avoids peeling between the conductive substrate 131 and the AlGaInN LED epitaxy structure 125. However, according to the method disclosed in U.S. Pat. No. 6,818,531, the thickness of the residue 125a of the n-type semiconductor layer should be so controlled as to ensure that the laser beam would not pass through the substrate to the adhesive layer 124. The residue 125a of the n-type semiconductor layer must be easy to remove as well. Therefore, the etching parameters must be controlled carefully to ensure the thickness of the residue 125a of the n-type semiconductor layer.

In addition, as the laser beam is employed on the sapphire substrate, the increase of the strain between the adhesive layer 124 and the AlGaInN LED epitaxy structure 125 results in instability of the AlGaInN LED epitaxy structure, which also causes peeling between each layer of the epitaxy structure.

SUMMARY OF THE INVENTION

One aspect of the present invention is to provide a method of fabricating a light emitting diode. In the steps of removing the substrate, the transparent dielectric layer protects the light emitting diode epitaxy structure, and improves the adhesion of the conductive substrate and the light emitting diode epitaxy structure, so that the conductive substrate will not peel from the light emitting diode epitaxy structure.

Another aspect of the present invention is to provide a light emitting diode having a transparent dielectric layer on the sidewall of the light emitting diode epitaxy structure to protect the light emitting diode epitaxy structure, and to avoid peeling occurrence between each layer of the light emitting diode epitaxy structure.

Still another aspect of the present invention is to provide a light emitting diode having a transparent dielectric layer on the sidewall of the light emitting diode epitaxy structure to enhance the sidewall output of the light from the light emitting diode.

The method of fabricating a light emitting diode of the present invention comprises the following steps. A light emitting diode epitaxy structure is formed on a substrate. The light emitting diode epitaxy structure is then etched to form a recess. A transparent dielectric layer is formed in the recess, and then a conductive substrate is bonded to the light emitting diode epitaxy structure. The substrate is subsequently removed.

The light emitting diode of the present invention includes a conductive substrate, a light emitting diode epitaxy structure and a transparent dielectric layer. The light emitting diode epitaxy structure is on the conductive substrate, and the transparent dielectric layer is on the sidewall of the light emitting diode epitaxy structure.

DETAILED DESCRIPTION

Figure 1:
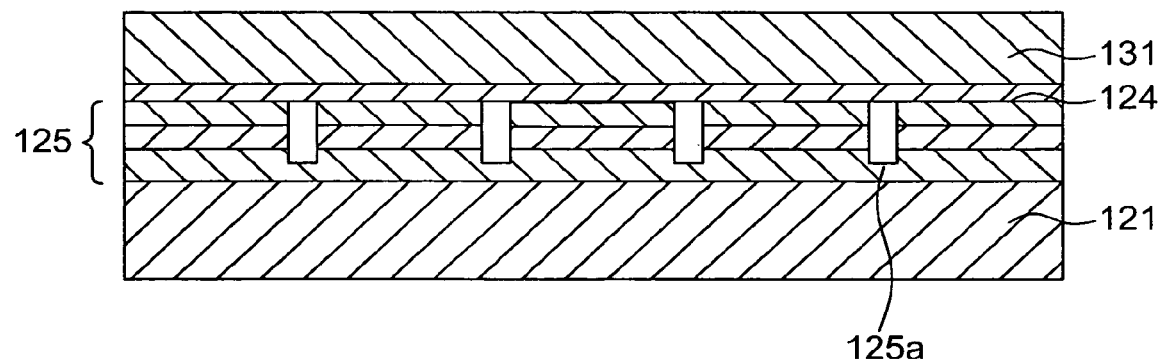
FIG. 1 is the structure of light emitting diode of the prior art.
Figure 2A:
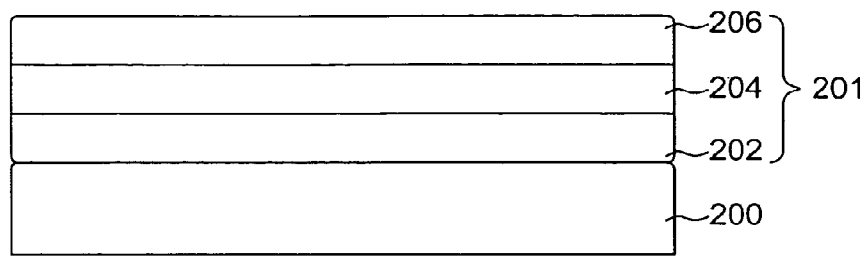
FIG. 2A-2E is the flow chart of fabricating one embodiment of the light emitting diode of the present invention.

Referring to FIG. 2A, a LED epitaxy structure 201 is first fabricated on a substrate 200. The LED epitaxy structure 201 mentioned herein includes an AlGaInP LED epitaxy structure and an AlGaInN LED epitaxy structure. To obtain an epitaxy structure of high quality, the selected material of the substrate 200 depends on the types of the LED epitaxy structure. As for the AlGaInP LED epitaxy structure, the preferred material of the substrate 200 is Ge, GaAs or InP. As for the AlGaInN LED epitaxy structure, the preferred material of the substrate 200 is sapphire, SiC, Si, $LiAlO_2$, ZnO or GaN. The steps of fabricating the LED epitaxy structure 201 includes sequentially forming an n-type semiconductor layer 202, an active layer 204, and a p-type semiconductor layer 206 on the substrate 200. The active layer 204 includes a homo-structure, a single hetero-structure, a double hetero-structure or a multi-quantum well structure.

Figure 2B:
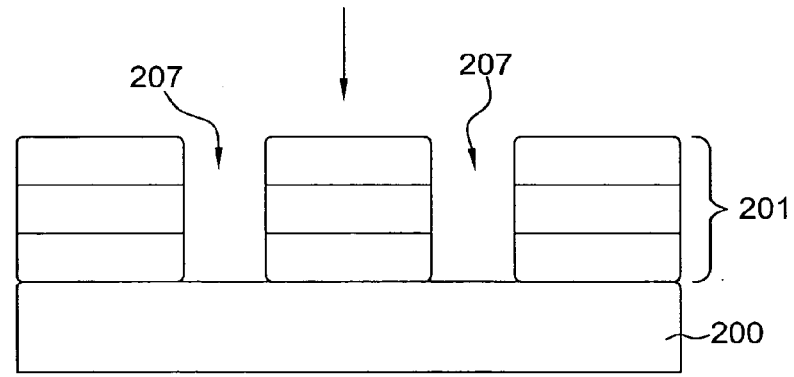

Referring to FIG. 2B, the LED epitaxy structure 201 is then etched to form a plurality of recesses 207 by using conventional lithography and etching technique. The distance between recesses 207 depends on the designed width of the LED epitaxy structure 201. The designed width of the LED epitaxy structure 201 is preferably the width of the final LED 20 (as shown in FIG. 2F). Since the materials of the LED epitaxy structure and the substrate are different, the only consideration for the etching agent is the capability to selectively etch different materials. Therefore, controlling process parameters to monitor the etching rate of the LED epitaxy structure described in the prior art is not necessary. An embodiment disclosed in FIG. 2B shows that the recesses 207 are formed and the substrate 200 is exposed. In other embodiment, the substrate 200 is optionally exposed.

Figure 2C:
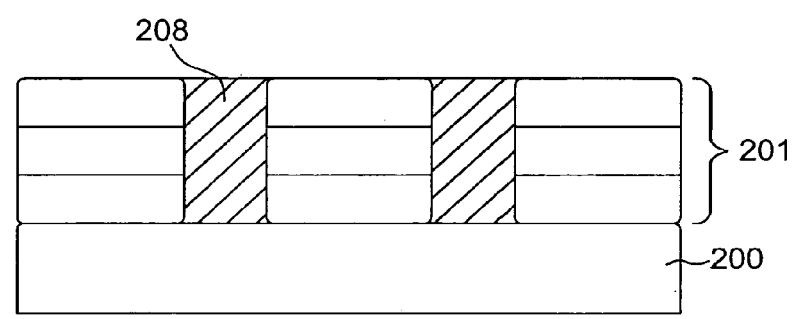
Figure 3:
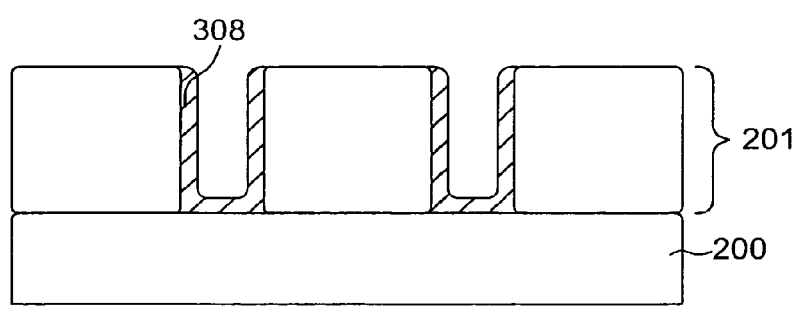
FIG. 3 is another embodiment of the present invention.

The transparent dielectric material is then filled in the recess 207, as shown in FIG. 2C, to form the transparent dielectric layer 208. The transparent dielectric layer 208 includes a material of $SiO_2$, $Si_3N_4$, benzocyclobutene or polyimide. In one embodiment, the transparent dielectric material may form a transparent dielectric liner 308 along the sidewall of the LED epitaxy structure 201 in the recess 207, as shown in FIG. 3, so that the sidewall of the LED epitaxy structure 201 will be clad in the transparent dielectric liner 308. In a preferred embodiment, the recess 207 is filled up with the transparent dielectric material, so that the transparent dielectric layer 208 is thick enough for following cutting step. In addition, with the thick transparent dielectric layer 208, the sidewall output of the light from the LED will increase.

Figure 2D:
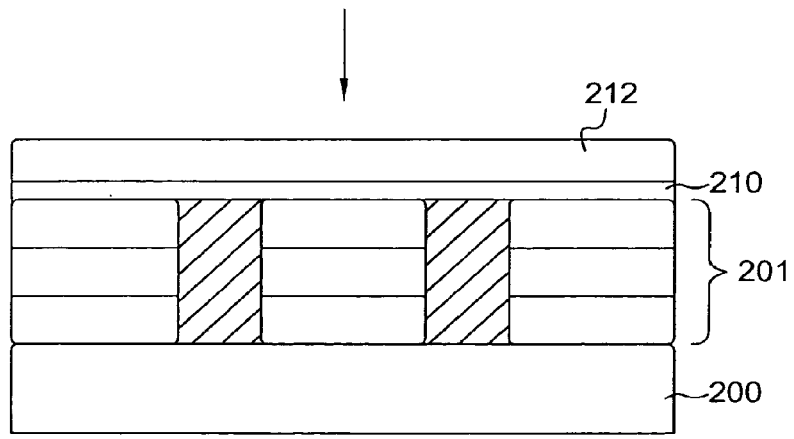

A conductive substrate 212 is next bonded to an upper surface of the LED epitaxy structure 201, as shown in FIG. 2D, by first forming an adhesive layer 210 on the conductive substrate 212, and then the adhesive layer 210 is attached to the LED epitaxy structure 201 by thermal compression technique. The adhesive layer 210 is one of the materials of Au, Sn, In, Ag, Ge, Cu, Pb or the alloy thereof. Since the conductive substrate 212 is metal or alloy with high reflectivity, the light generated by the LED epitaxy structure 201 will emit toward a same direction. Therefore, any other additional reflective layers will not be necessary.

Figure 2E:
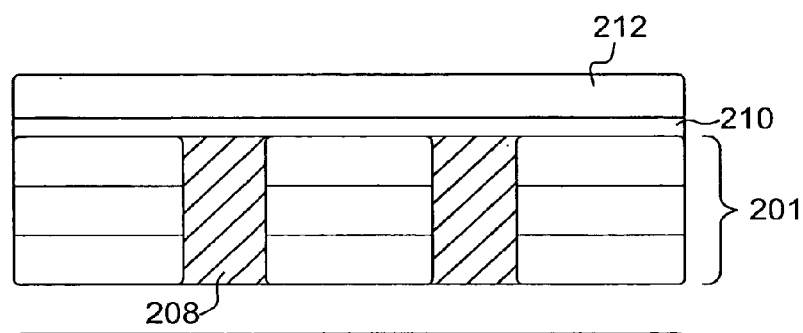
Figure 2F:
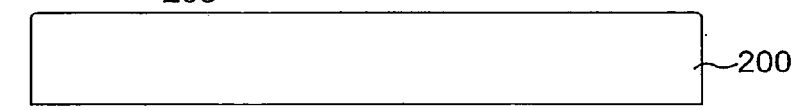
FIG. 2F is one embodiment of the light emitting diode of the present invention.

As shown in FIG. 2E, the step of removing the substrate 200 is performed. AlGaInN LED epitaxy structure is used as an example. As a laser beam (arrow icon L) is irradiated on the lower surface of the substrate 200, the laser beam passes through the substrate 200, decomposes the AlGaInN LED epitaxy structure 201, contacting the substrate, into Ga and N.sub.2, and then melts Ga by heat of a designated temperature. Thus the substrate 200 is easily removed from the AlGaInN LED epitaxy structure 201. In addition, peeling between each layer of the LED epitaxy structure 201 will degrade, since the transparent dielectric layer 208 affixes the LED epitaxy structure 201. The transparent dielectric layer 208 facilitates the bonding of the conductive substrate 212 and the LED epitaxy structure 201, therefore peeling between the adhesive layer 210 and the LED epitaxy structure 201 will be avoided.

Finally, the anode 214 is fabricated on the top of the LED epitaxy structure 201 and the cathode 216 is fabricated under the conductive substrate 212, respectively, and then the transparent dielectric layer 208 is cut by a conventional cutting step to form a final structure of the LED 20, as shown in FIG. 2F.

The LED 20, shown in FIG. 2F, has the transparent dielectric layer 208 on the sidewall. Since the index of reflection of semiconductor material in the LED epitaxy structure 201 (e.g. the index of reflection of GaN is about 2.4) is different from that of the external medium of the LED 20 (e.g. the index of reflection of air is about 1.5), the light from the LED 20 will be reflected at the sidewall interface of the LED 20. However, the transparent dielectric layer 208 has high transparency, and the index of reflection of the transparent dielectric layer 208 is such that full reflection of light is avoided. The sidewall light from the LED 20 can easily pass through the transparent dielectric layer 208 to the external medium of the LED 20. Therefore, the transparent dielectric layer 208 enhances the sidewall outside of the light from the LED 20.

By means of the detailed descriptions of what is presently considered to be the most practical and preferred embodiments of the subject invention, it is the expectation that the features and the gist thereof are plainly revealed. Nevertheless, these above-mentioned illustrations are not intended to be construed in a limiting sense. Instead, it should be well understood that any analogous variation and equivalent arrangement is supposed to be covered within the spirit and scope to be protected and that the interpretation of the scope of the subject invention would therefore as much broadly as it could apply.

What is claimed is:

1. A method of fabricating a light emitting diode, comprising:
   providing a substrate;
   forming a light emitting diode epitaxy structure on the substrate;
   etching the light emitting diode epitaxy structure to form a recess;
   forming a transparent dielectric layer only in the recess;
   forming an adhesive layer on a conductive substrate, wherein the adhesive layer is electrically connected with the conductive substrate; and
   bonding the conductive substrate to the light emitting diode epitaxy structure after forming the adhesive layer on the conductive substrate.

2. The method of claim 1, wherein the transparent dielectric layer comprises a material selected from a group consisting of SiO2, Si3N4, bisbenzocyclobutene and polyimide.

3. The method of claim 1, wherein the adhesive layer comprises a material selected from a group consisting of Au, Sn, In, Ag, Ge, Cu, Pb and an alloy thereof.

4. The method of claim 1, wherein the step of forming the light emitting diode epitaxy structure comprises:
   forming a first doped semiconductor layer on the substrate;
   forming an active layer on the first doped semiconductor layer; and
   forming a second doped semiconductor layer on the active layer.

5. The method of claim 1, wherein the step of etching the light emitting diode epitaxy structure exposes the substrate.

6. The method of claim 1, further comprising forming an anode on the top of the light emitting diode epitaxy structure wherein the anode is disposed in the middle at the top of the light emitting diode epitaxial structure.

7. The method of claim 1, wherein the step of forming the transparent dielectric layer only in the recess comprises filling up the recess with the transparent dielectric layer.

8. The method of claim 1, further comprising removing the substrate after bonding the conductive substrate to the light emitting diode epitaxy structure.

9. The method of claim 8, wherein the step of removing the substrate comprises irradiating a laser beam on the substrate.

10. A method of fabricating a light emitting diode, comprising:
    providing a first substrate;
    forming a light emitting diode epitaxy structure on the first substrate;

removing a portion of the light emitting diode epitaxy structure to form a recess;
forming a transparent dielectric layer only in the recess;
providing a second substrate;
forming an adhesive layer on the second substrate, wherein the adhesive layer is electrically connected with the second substrate; and
bonding the second substrate to the light emitting diode epitaxy structure after forming the adhesive layer on the second substrate.

11. The method of claim 10, wherein the transparent dielectric layer comprises a material selected from a group consisting of SiO2, Si3N4, bisbenzocyclobutene and polyimide.

12. The method of claim 10, wherein the adhesive layer comprises a material selected from a group consisting of Au, Sn, In, Ag, Ge, Cu, Pb and an alloy thereof.

13. The method of claim 10, wherein the step of forming the light emitting diode epitaxy structure comprises:
   forming a first doped semiconductor layer on the substrate;
   forming an active layer on the first doped semiconductor layer; and
   forming a second doped semiconductor layer on the active layer.

14. The method of claim 10, wherein the step of removing a portion of the light emitting diode epitaxy structure exposes the first substrate.

15. The method of claim 10, wherein the second substrate is a conductive substrate.

16. The method of claim 10, wherein the step of forming the transparent dielectric layer only in the recess comprises filling up the recess with the transparent dielectric layer.

17. The method of claim 10, further comprising forming an anode on the top of the light emitting diode epitaxy structure, wherein the anode is disposed in the middle at the top of the light emitting diode epitaxy structure.

18. The method of claim 10, further comprising removing the first substrate after bonding the second substrate to the light emitting diode epitaxy structure.

19. The method of claim 18, wherein the step of removing the first substrate comprises irradiating a laser beam on the first substrate.

* * * * *